(12) United States Patent  
Yamaura et al.

(10) Patent No.: US 12,284,848 B2  
(45) Date of Patent: Apr. 22, 2025

(54) PHOSPHOR PLATE, LIGHT EMITTING DEVICE, AND METHOD FOR MANUFACTURING PHOSPHOR PLATE

(71) Applicant: DENKA COMPANY LIMITED, Tokyo (JP)

(72) Inventors: Taiyo Yamaura, Tokyo (JP); Yuki Kubota, Tokyo (JP); Kazuhiro Ito, Tokyo (JP); Hideyuki Emoto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 523 days.

(21) Appl. No.: 17/769,902

(22) PCT Filed: Oct. 7, 2020

(86) PCT No.: PCT/JP2020/037946  
§ 371 (c)(1),  
(2) Date: Apr. 18, 2022

(87) PCT Pub. No.: WO2021/079739  
PCT Pub. Date: Apr. 29, 2021

(65) Prior Publication Data  
US 2022/0399480 A1 Dec. 15, 2022

(30) Foreign Application Priority Data  
Oct. 23, 2019 (JP) .................. 2019-192949

(51) Int. Cl.  
*H01L 33/50* (2010.01)  
*C09K 11/67* (2006.01)  
(Continued)

(52) U.S. Cl.  
CPC ....... *H10H 20/8512* (2025.01); *C09K 11/676* (2013.01); *H10H 20/8514* (2025.01); *H10H 20/825* (2025.01)

(58) Field of Classification Search  
CPC ..... H01L 33/502; H01L 33/505; H01L 33/32; C09K 11/676; H10H 20/8512; H10H 20/8514; H10H 20/825  
See application file for complete search history.

(56) References Cited

U.S. PATENT DOCUMENTS 8,344,404 B2   1/2013   Fujita et al.  
8,628,687 B2   1/2014   Yamao et al.  
(Continued)

FOREIGN PATENT DOCUMENTS

CN   102300955 A   12/2011  
CN   104169637 A   11/2014  
(Continued)

OTHER PUBLICATIONS

Feb. 8, 2023 Office Action issued in Chinese Patent Application No. 202080073690.7.  
(Continued)

*Primary Examiner* — Tracie Y Green  
(74) *Attorney, Agent, or Firm* — Oliff PLC

(57) ABSTRACT

A phosphor plate including: a complex containing an α-sialon phosphor and a sintered body containing spinel represented by a general formula $M_{2x}Al_{4-4x}O_{6-4x}$ (where M represents at least one of Mg, Mn, and Zn, and $0.2<x<0.6$). In addition, there is provided a light emitting device including: a group III nitride semiconductor light emitting element; and the phosphor plate provided on one surface of the group III nitride semiconductor light emitting element. Further, there is provided a method for manufacturing the phosphor plate.

10 Claims, 1 Drawing Sheet

(51) Int. Cl.
*H10H 20/851* (2025.01)
*H10H 20/825* (2025.01)

(56) References Cited

U.S. PATENT DOCUMENTS

| | | | |
|---|---|---|---|
| 8,663,500 B2 | 3/2014 | Emoto et al. | |
| 9,146,453 B2 | 9/2015 | Kasugai et al. | |
| 9,570,655 B2 | 2/2017 | Yoshimura et al. | |
| 9,711,686 B2 | 7/2017 | Yoshimura et al. | |
| 9,929,323 B2 | 3/2018 | Hashimoto | |
| 10,060,596 B2 | 8/2018 | Blees et al. | |
| 10,153,410 B2 | 12/2018 | Hashimoto | |
| 10,825,968 B2 | 11/2020 | Hashimoto | |
| 10,886,437 B2 | 1/2021 | Camras et al. | |
| 11,041,606 B1 | 6/2021 | Furuyama | |
| 11,063,192 B2 | 7/2021 | Tamaki et al. | |
| 11,377,594 B2* | 7/2022 | Kobayashi | H01L 33/502 |
| 11,807,791 B2* | 11/2023 | Yamaura | H01L 33/502 |
| 2009/0284948 A1 | 11/2009 | Yamao et al. | |
| 2011/0006329 A1 | 1/2011 | Fujita et al. | |
| 2011/0279018 A1 | 11/2011 | Emoto et al. | |
| 2013/0001815 A1 | 1/2013 | Yamao et al. | |
| 2013/0285104 A1 | 10/2013 | Yoshimura et al. | |
| 2015/0002824 A1 | 1/2015 | Kasugai et al. | |
| 2016/0204311 A1 | 7/2016 | Yoshimura et al. | |
| 2017/0033267 A1 | 2/2017 | Tamaki et al. | |
| 2017/0051892 A1 | 2/2017 | Blees et al. | |
| 2017/0294563 A1 | 10/2017 | Hashimoto | |
| 2018/0122993 A1 | 5/2018 | Camras et al. | |
| 2018/0175259 A1 | 6/2018 | Hashimoto | |
| 2019/0031956 A1* | 1/2019 | Inata | H01L 33/502 |
| 2019/0074414 A1 | 3/2019 | Hashimoto | |
| 2019/0106621 A1 | 4/2019 | Liu et al. | |
| 2020/0243726 A1* | 7/2020 | Shimizu | C03C 14/006 |
| 2021/0172583 A1 | 6/2021 | Furuyama | |
| 2022/0350061 A1* | 11/2022 | Yamaura | C09K 11/02 |
| 2023/0113551 A1* | 4/2023 | Sugita | G02B 5/20 257/98 |

FOREIGN PATENT DOCUMENTS

| | | |
|---|---|---|
| CN | 106410012 A | 2/2017 |
| CN | 107275457 A | 10/2017 |
| JP | 2000-281335 A | 10/2000 |
| JP | 2009-260234 A | 11/2009 |
| JP | 2010-132923 A | 6/2010 |
| JP | 2011-122067 A | 6/2011 |
| JP | 2014-234487 A | 12/2014 |
| JP | 2016-225581 A | 12/2016 |
| JP | 2018-072607 A | 5/2018 |
| JP | 2018-109075 A | 7/2018 |
| TW | 201530831 A | 8/2015 |
| TW | 201914975 A | 4/2019 |
| WO | 2008/004640 A1 | 1/2008 |
| WO | 2012/098932 A1 | 7/2012 |
| WO | 2019/102787 A1 | 5/2019 |
| WO | 2019/116916 A1 | 6/2019 |

OTHER PUBLICATIONS

Dec. 1, 2020 International Search Report issued in International Patent Application No. PCT/JP2020/037946.
Nov. 28, 2023 Office Action Issued in Taiwanese Patent Application No. 109135115.

* cited by examiner

PHOSPHOR PLATE, LIGHT EMITTING DEVICE, AND METHOD FOR MANUFACTURING PHOSPHOR PLATE

TECHNICAL FIELD

The present invention relates to a phosphor plate, a light emitting device, and a method for manufacturing a phosphor plate. More specifically, the present invention relates to a phosphor plate, a light emitting device including the phosphor plate, and a method for manufacturing a phosphor plate.

BACKGROUND ART

So far, various phosphor plates have been developed. As this type of technology, for example, a technology described in Patent Document 1 is known. Patent Document 1 describes a plate-shaped emission color conversion member in which an inorganic phosphor is dispersed in $SiO_2$-based glass (FIG. 4 and claim 1 of Patent Document 1).

RELATED DOCUMENT

Patent Document

[Patent Document 1] Japanese Unexamined Patent Publication No. 2010-132923

SUMMARY OF THE INVENTION

Technical Problem

According to the findings of the inventors, there is room for improvement in the luminous efficiency of the plate-shaped emission color conversion member in which the inorganic phosphor is dispersed in the $SiO_2$-based glass as described in Patent Document 1.

The present invention has been made in view of such circumstances.

One of the objects of the present invention is to provide a phosphor plate having excellent luminous efficiency and a light emitting device using the same.

Solution to Problem

The inventors have completed the present invention provided below and solved the above-described problem.

According to the present invention, there is provided a phosphor plate including: a complex containing an α-sialon phosphor and a sintered body containing spinel represented by a general formula $M_{2x}Al_{4-4x}O_{6-4x}$ (where M represents at least one of Mg, Mn, and Zn, and $0.2<x<0.6$).

In addition, according to the present invention, there is provided a light emitting device including: a group III nitride semiconductor light emitting element; and the phosphor plate provided on one surface of the group III nitride semiconductor light emitting element.

Further, according to the present invention, there is provided a method for manufacturing the phosphor plate, method including: a firing step of heating a mixture containing an α-sialon phosphor and a spinel raw material powder, in which the spinel raw material powder is (i) a powder containing spinel represented by the general formula, and/or (ii) a mixture of a metal oxide powder represented by a general formula MO (M represents at least one of Mg, Mn, and Zn) and an $Al_2O_3$ powder, and a BET specific surface area of the spinel raw material powder is equal to or more than 0.1 m²/g and equal to or less than 10.0 m²/g.

Advantageous Effects of Invention

According to the present invention, there is provided a phosphor plate having excellent luminous efficiency and a light emitting device using the same.

DESCRIPTION OF EMBODIMENTS

Figure 1:
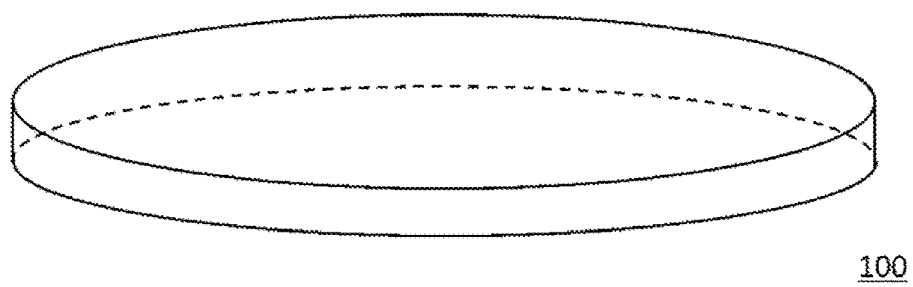
FIG. 1 is a schematic view showing an example of a configuration of a phosphor plate.

Hereinafter, embodiments of the present invention will be described in detail with reference to the drawings.

In all drawings, similar components will be given the same reference numerals, and the description thereof will not be repeated.

In order to avoid complication, (i) in a case where there are a plurality of the same components in the same drawing, only one of these may be given a reference numeral and not all of these may be given the reference numeral, or (ii) particularly in FIG. 2 and subsequent drawings, the same components as those in FIG. 1 may not be given reference numerals again.

All drawings are merely for description. The shape and dimensional ratio of each member in the drawing do not necessarily correspond to those of the actual article.

<Phosphor Plate>

A phosphor plate of the present embodiment includes a complex containing an α-sialon phosphor and a sintered body containing spinel represented by a general formula $M_{2x}Al_{4-4x}O_{6-4x}$ (where M represents at least one of Mg, Mn, and Zn, and $0.2<x<0.6$).

The phosphor plate of the present embodiment can be used as a wavelength converter that converts the irradiated blue light into orange light and emits the converted orange light.

According to the findings of the inventors, the luminous efficiency of the phosphor plate of the present embodiment is excellent. The reason for this is not always clear, but the following reasons are presumed.

(i) The sintered body containing spinel represented by the general formula is relatively transparent. Therefore, excessive scattering of light in the phosphor plate is suppressed.

(ii) The refractive index of the spinel is approximately 1.7, which is close to the refractive index of the oxynitride phosphor (approximately 2.0). Therefore, the light extraction efficiency from the phosphor is high.

When the phosphor plate of the present embodiment is irradiated with blue light having a wavelength of 455 nm, the peak wavelength of the wavelength conversion light emitted from the phosphor plate is, for example, equal to or more than 585 nm and equal to or less than 605 nm. By combining the phosphor plate of the present embodiment with a light emitting element that emits blue light, it is possible to obtain a light emitting device that emits orange color with high brightness.

Hereinafter, a more specific description of the phosphor plate of the present embodiment will be continued.

The α-sialon phosphor and the spinel are mixed in a complex that forms the phosphor plate. The mixed state means a state where the α-sialon phosphor is dispersed in the spinel that is a base material (matrix phase). In other words, the complex may have a structure in which α-sialon phosphor particles are dispersed between the crystal grains and/or within the crystal grains of the (poly)crystals formed of the base material. The α-sialon phosphor particles may be uniformly dispersed in the base material (sintered body containing spinel).

(α-Sialon Phosphor)

The α-sialon phosphor preferably includes an α-sialon phosphor containing an Eu element represented by the following general formula (1).

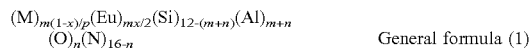

General formula (1)

In general formula (1), M represents one or more elements selected from the group consisting of Li, Mg, Ca, Y, and lanthanide elements (excluding La and Ce), p represents a valence of the M element, and $0<x<0.5$, $1.5 \le m \le 4.0$ and $0 \le n \le 2.0$.

n may be, for example, equal to or less than 2.0, equal to or less than 1.0, or equal to or less than 0.8.

The solid solution composition of α-sialon replaces m Si—N bonds of α-silicon nitride unit cells ($Si_{12}N_{16}$) with Al—N bonds and replaces n Si—N bonds with Al—O bonds, and is represented by the above-described general formula in which m/p cations (M, Eu) penetrate into the crystal lattice and dissolve in order to maintain electrical neutrality. In particular, when Ca is used as M, α-sialon is stabilized in a wide composition range, and by replacing a part thereof with Eu, which is the emission center, a phosphor that is excited by light in a wide wavelength range from ultraviolet to blue and exhibits visible light emission from yellow to orange can be obtained.

In general, since α-sialon has a second crystal phase different from α-sialon or an amorphous phase that is inevitably present, the solid solution composition cannot be strictly defined by composition analysis or the like. As the crystal phase of α-sialon, α-sialon single phase is preferable, and as other crystal phases, β-sialon, aluminum nitride or polytypoids thereof, $Ca_2Si_5N_8$, $CaAlSiN_3$ and the like may be contained.

As a method for manufacturing the α-sialon phosphor, there is a method in which a mixed powder formed of a compound of silicon nitride, aluminum nitride, and an interstitial solid solution element is heated and reacted in a high-temperature nitrogen atmosphere. In the heating step, some of the constituents form a liquid phase, and the substance moves to this liquid phase to produce an α-sialon solid solution.

The lower limit of a median diameter $D_{50}$ of the α-sialon phosphor is preferably equal to or more than 2 μm, more preferably equal to or more than 5 μm, and still more preferably equal to or more than 10 μm. The upper limit of the $D_{50}$ of the α-sialon phosphor is preferably equal to or less than 30 μm, and more preferably equal to or less than 20 μm. By setting the $D_{50}$ of the α-sialon phosphor to be equal to or more than 5 μm, the transparency of the complex can be further enhanced. Meanwhile, by setting the $D_{50}$ of the α-sialon phosphor to be equal to or less than 30 μm, it is possible to suppress the occurrence of chipping when the phosphor plate is cut with a dicer or the like.

As the $D_{50}$ of the α-sialon phosphor, a particle size of 50% of the accumulated passage amount (integrated passage amount ratio) from the small particle size side can be adopted in the volume-based particle size distribution obtained by measurement by the laser diffraction and scattering type particle size distribution measurement method. In other words, the $D_{50}$ in the present specification is a value on a volume basis.

The laser diffraction and scattering type particle size distribution measurement method can be performed by a known device, for example, LS13-320 manufactured by Beckman Coulter, Inc.

The lower limit value of the content of the α-sialon phosphor is, for example, equal to or more than 5% by volume, preferably equal to or more than 10% by volume, and more preferably equal to or more than 15% by volume in terms of volume with respect to the entire complex. Accordingly, it is possible to increase the emission intensity in the thin-layer phosphor plate. In addition, the light conversion efficiency of the phosphor plate can be improved.

The upper limit value of the content of the α-sialon phosphor is, for example, equal to or less than 50% by volume, preferably equal to or less than 45% by volume, and more preferably equal to or less than 40% by volume in terms of volume with respect to the entire complex. When the content of the α-sialon phosphor is not extremely large, it is possible to suppress a decrease in the thermal conductivity of the phosphor plate. Moreover, since a sufficient amount of spinel can be used, the effect derived from spinel can be sufficiently obtained.

(Sintered Body Containing Spinel)

In the present embodiment, the spinel is represented by the general formula $M_{2x}Al_{4-4x}O_{6-4x}$ (M is at least one of Mg, Mn, and Zn, and $0.2<x<0.6$).

A sintered body containing spinel is usually obtained by mixing and sintering a metal oxide powder represented by the general formula MO (M is at least one of Mg, Mn, and Zn) and an $Al_2O_3$ powder.

Stoichiometrically, spinel has a composition represented by $x=0.5$ (that is, the general formula $MAl_2O_4$). However, depending on the ratio of the amount of MO of the raw material to the amount of $Al_2O_3$, spinel becomes a compound having a non-stoichiometric composition in which MO or $Al_2O_3$ is excessively dissolved.

From the viewpoint of transparency, M in the above-described general formula is preferably Mg.

(Total Value of Content of Sintered Body Containing α-Sialon Phosphor and Spinel)

The lower limit value of the content of the sintered body containing the α-sialon phosphor and the spinel in the phosphor plate is, for example, equal to or more than 95% by volume, preferably equal to or more than 98% by volume, and more preferably equal to or more than 99% by volume, with respect to the entire complex. In other words, this means that the complex that forms the phosphor plate contains a sintered body containing an α-sialon phosphor and spinel as a main component. Accordingly, heat resistance and durability can be improved, and stable luminous efficiency can be realized.

The upper limit value of the content of the sintered body containing the α-sialon phosphor and the spinel is not particularly limited, and may be, for example, equal to or less than 100% by volume in terms of volume with respect to the entire complex.

(Surface Roughness of Phosphor Plate)

A surface roughness Ra on the main surface and/or the back surface of the phosphor plate is, for example, equal to or more than 0.01 μm and equal to or less than 2.0 μm, and preferably equal to or more than 0.03 μm and equal to or less than 1.5 μm. Ra is determined by measurement in accordance with JIS B 0601.

By setting the surface roughness to be equal to or less than 2.0 μm, it is possible to suppress variations in light extraction efficiency and light intensity in the in-plane direction. By setting the surface roughness to be equal to or more than 0.01 μm, it is expected that the adhesion to the adherend can be improved.

At least the main surface, or both the main surface and the back surface of the phosphor plate, may be surface-treated. Examples of the surface treatment include grinding using a diamond grindstone or the like, lapping, and polishing. Ra can be adjusted by surface treatment.

(Color of Phosphor Plate)

The color of the phosphor plate is roughly yellow, orange, and the like derived from the color of the α-sialon phosphor. However, the color of the phosphor plate changes depending on the manufacturing method or the properties of the metal oxide which is the raw material of spinel. Then, it is considered that the non-luminous absorption can be reduced and the luminous efficiency can be further improved by appropriately designing the color of the phosphor plate.

Specifically, the L*a*b* color coordinates of the main surface (the surface that emits fluorescence) of the phosphor plate measured in accordance with JIS Z 8781-4 are as follows.

L* value: Usually equal to or more than 72.0 and equal to or less than 95.0, preferably equal to or more than 82.0 and equal to or less than 90.0, and more preferably equal to or more than 84.0 and equal to or less than 90.0 a* value: Usually equal to or more than 1.5 and equal to or less than 6.5, preferably equal to or more than 3.0 and equal to or less than 6.0, and more preferably equal to or more than 3.5 and equal to or less than 5.5 b* value: Usually equal to or more than 10.0 and equal to or less than 16.0, preferably equal to or more than 11.5 and equal to or less than 15.0, and more preferably equal to or more than 12.5 and equal to or less than 15.0

According to the findings of the inventors, in particular, the phosphor plate in which the sum of the a* value and the b* value is an appropriate value shows good luminous efficiency. Specifically, the sum of the a* value and the b* value is preferably equal to or more than 11.0 and equal to or less than 20.0, more preferably equal to or more than 17.0 and equal to or less than 19.5, and further preferably equal to or more than 17.5 and equal to or less than 19.0. Although the detailed mechanism is not clear, by controlling the sum of the a* value and the b* value to an appropriate range, the non-luminous absorption of the phosphor plate containing the α-sialon phosphor and the spinel in the light emitting region can be reduced, and thus it is considered that the decrease in luminous efficiency can be suppressed.

In the method for manufacturing the phosphor plate (which will be described later), for example, the color (L*a*b* color coordinates) of the phosphor plate can be adjusted by using a material having an appropriate specific surface area, as the divalent metal oxide powder and/or the $Al_2O_3$ powder, which are raw materials.

(Thickness and Shape of Phosphor Plate)

The thickness and shape of the phosphor plate of the present embodiment are not particularly limited. The thickness and shape are not particularly limited as long as the phosphor plate can be used as an emission color conversion member.

The thickness of the phosphor plate is, for example, equal to or more than 0.01 mm and equal to or less than 1.00 mm, and preferably equal to or more than 0.05 mm and equal to or less than 0.50 mm.

<Method for Manufacturing Phosphor Plate>

The phosphor plate of the present embodiment can be produced, for example, by a step including a firing step of heating the mixture containing the α-sialon phosphor and the spinel raw material powder.

Here, the "spinel raw material powder" is, for example, (i) a powder containing spinel represented by the above-described general formula $M_{2x}Al_{4-4x}O_{6-4x}$, and/or (ii) a mixture of a metal oxide represented by the general formula MO (M is at least one of Mg, Mn, and Zn) and an $Al_2O_3$ powder.

The raw material is preferably as pure as possible. Specifically, the impurities of elements other than the desired constituent elements are preferably equal to or less than 0.1%.

Further, when producing the phosphor plate, it is preferable to use a fine powder of spinel raw material powder because refinement proceeds by sintering. Specifically, the average particle size of the spinel raw material powder of the raw material is preferably equal to or less than 1 μm.

According to the findings of the inventors, by using a spinel raw material powder having a relatively small BET specific surface area, the luminous efficiency of the finally obtained phosphor plate can be further improved. The reason for this is not always clear, but it is considered that this is because, by using a spinel raw material powder having a relatively small specific surface area, sintering becomes gentler, and blackening is suppressed as compared with a case of using a spinel raw material having a large specific surface area.

As a specific numerical value, the BET specific surface area of the spinel raw material powder is, for example, equal to or more than 0.1 m$^2$/g and equal to or less than 20.0 m$^2$/g, and preferably equal to or more than 0.1 m$^2$/g and equal to or less than 10.0 m$^2$/g.

Here, when the spinel raw material powder is a mixture of the metal oxide powder represented by the general formula MO and the $Al_2O_3$ powder of the above-described (ii), the specific surface area of the mixture as a whole, that is, Σ (the specific surface area of each powder×the mass ratio of each powder in the spinel raw material powder) is adopted as the specific surface area of the spinel raw material powder.

As a mixing method for obtaining a mixture for firing, various dry and wet methods can be applied. A method is preferable in which the α-sialon phosphor particles used as a raw material are not pulverized as much as possible and impurities from the device are not mixed as much as possible during mixing.

The firing temperature is, for example, equal to or higher than 1300° C. and equal to or lower than 1700° C. In order to refine the complex, it is preferable that the firing temperature is high. However, the higher the firing temperature, the lower the fluorescence characteristics of the α-sialon phosphor. Therefore, firing at an appropriate temperature is preferable.

The firing method may be normal pressure sintering or pressure sintering. In order to suppress deterioration of the characteristics of the α-sialon phosphor and obtain a refined complex, pressure sintering, which is easier to perform refining than normal pressure sintering, is preferable. Examples of the pressure sintering method include hot press sintering, spark plasma sintering (SPS), and hot isotropic pressure sintering (HIP). In a case of the hot press sintering or SPS sintering, the pressure is preferably equal to or more than 10 MPa, preferably equal to or more than 30 MPa, and preferably equal to or less than 100 MPa.

The firing atmosphere is preferably a non-oxidizing inert gas such as nitrogen or argon, or a vacuum atmosphere in order to prevent the oxidation of α-sialon.

<Light Emitting Device>

A light emitting device of the present embodiment includes: a group III nitride semiconductor light emitting element (light emitting element 20); and a phosphor plate 10 described above, which is provided on one surface of the group III nitride semiconductor light emitting element.

Examples of the group III nitride semiconductor light emitting element include an n layer, a light emitting layer, and a p layer formed of a group III nitride semiconductor such as an AlGaN, GaN, and InAlGaN-based material. As a group III nitride semiconductor light emitting element, a blue LED that emits blue light can be used.

The phosphor plate 10 may be disposed directly on one surface of the light emitting element 20, or may be disposed using a light transmitting member or a spacer.

As the phosphor plate 10 disposed on the light emitting element 20, a disk-shaped phosphor plate 100 (phosphor wafer) shown in FIG. 1 may be used, but individually separated phosphor plates 100 may also be used.

FIG. 1 is a schematic view showing an example of a configuration of the phosphor plate. The thickness of the phosphor plate 100 shown in FIG. 1 is, for example, equal to or more than 100 μm and equal to or less than 1 mm. The thickness of the phosphor plate 100 may be adjusted by grinding or the like after the above-described manufacturing process (firing or the like).

Incidentally, the disk-shaped phosphor plate 100 has excellent durability and transportability because the occurrence of chipping and cracking at the corners is suppressed as compared with a case of the rectangular shape.

Figure 2A:
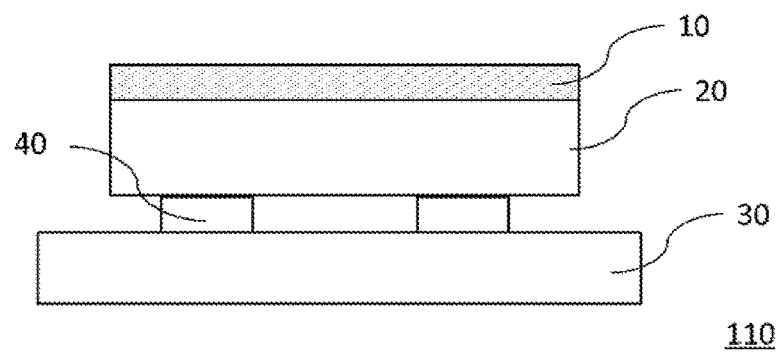
FIG. 2(a) is a sectional view schematically showing a configuration of a flip-chip type light emitting device.
Figure 2B:
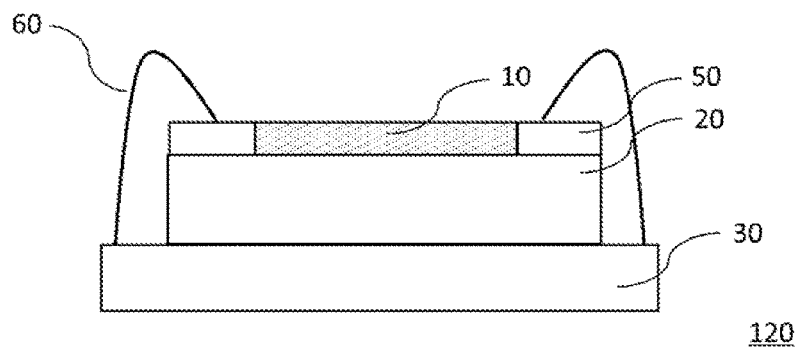
FIG. 2(b) is a sectional view schematically showing a configuration of a wire bonding type light emitting element.

An example of the light emitting device is shown in FIGS. 2(a) and 2(b). FIG. 2(a) is a sectional view schematically showing a configuration of a flip-chip type light emitting device 110, and FIG. 2(b) is a sectional view schematically showing a configuration of a wire bonding type light emitting device 120.

The light emitting device 110 of FIG. 2(a) includes a substrate 30, the light emitting element 20 electrically connected to the substrate 30 through a solder 40 (die-bonding material), and the phosphor plate 10 provided on the light emitting surface of the light emitting element 20. The flip-chip type light emitting device 110 may have either a face-up type or a face-down type structure.

In addition, the light emitting device 120 of FIG. 2(b) includes the substrate 30, the light emitting element 20 electrically connected to the substrate 30 through a bonding wire 60 and an electrode 50, and the phosphor plate 10 provided on the light emitting surface of the light emitting element 20.

In FIG. 2, the light emitting element 20 and the phosphor plate 10 are attached by a known method, and may be attached by, for example, a silicone-based adhesive or a heat fusion method.

The light emitting device 110 and the light emitting device 120 may be entirely sealed with a transparent sealing material.

The individually separated phosphor plates 10 may be attached to the light emitting element 20 mounted on the substrate 30. After attaching a plurality of light emitting elements 20 to the large-area phosphor plate 100, the light emitting elements 20 with the phosphor plate 10 may be individually separated by dicing. Further, the large-area phosphor plate 100 may be attached to a semiconductor wafer having a plurality of light emitting elements 20 formed on the surface thereof, and then collectively, the semiconductor wafer and the phosphor plate 100 may be individually separated.

Although the embodiments of the present invention have been described above, these are examples of the present invention, and various configurations other than the above can be adopted. Further, the present invention is not limited to the above-described embodiment, and modifications, improvements, and the like to the extent that the object of the present invention can be achieved are included in the present invention.

EXAMPLES

Embodiments of the present invention will be described in detail based on Examples and Comparative Examples. As a reminder, the invention is not limited to Examples.

(Manufacturing of Phosphor Plate)

A phosphor plate was manufactured by the following procedure.

(1) The α-sialon phosphor shown in Table 1 below and the spinel raw material powder (MgO and $Al_2O_3$) were wet-mixed in an ethanol solvent for 30 minutes using a polyethylene pot and an alumina ball, the obtained slurry was suction-filtered to remove the solvent, and then dried. Then, the mixed raw material was disaggregated through a nylon mesh sieve having an opening of 75 μm to obtain a raw material mixed powder.

The amount of α-sialon phosphor was adjusted to be 30% by volume in the raw material mixed powder (the residual 70% by volume is MgO and $Al_2O_3$).

The ratio of MgO and $Al_2O_3$ in the spinel raw material powder was set to MgO:$Al_2O_3$=28:72 (Mg:Al=1:2 in terms of molar amount) in terms of mass ratio.

(2) The hot press jig was filled with the raw material mixed powder. Specifically, a carbon die having an inner diameter of 30 mm in which a carbon lower punch was set was filled with approximately 10 g of the raw material mixed powder. After this, a carbon upper punch was set and the raw material powder was sandwiched.

A carbon sheet (GRAFOIL manufactured by GraTech) having a thickness of 0.127 mm was set between the raw material mixed powder and the carbon jig to prevent sticking.

(3) A hot press jig filled with the raw material mixed powder was set in a multi-purpose high-temperature furnace (High Multi 5000 manufactured by Fuji Dempa Kogyo Co., Ltd.,) equipped with a carbon heater. The inside of the furnace was evacuated to be equal to or less than 0.1 Pa, and the upper and lower punches were pressurized with a pressure of 55 MPa while maintaining the reduced pressure state. While maintaining the pressurized state, the temperature was raised to 1600° C. at a rate of 5° C. per minute. After reaching 1600° C., heating was stopped, the mixture was slowly cooled to room temperature, and the pressure was depressurized. Then, the fired product having an outer diameter of 30 mm was collected, and the outer peripheral portion was ground using a surface grinding machine and a cylindrical grinding machine. As a result, a disk-shaped phosphor plate having a diameter of 25 mm was obtained (thickness is shown in the table).

XRD measurement using CuKα ray was performed on the obtained sample using an X-ray diffractometer (Ultima IV manufactured by Rigaku Corporation). From the obtained X-ray diffraction pattern, it was confirmed that α-sialon and spinel were present as the main phases.

Further, for SEM observation, the obtained phosphor plate was polished and the polished surface was observed by SEM. As a result, in the phosphor plates of Examples 1 to 10, a state where α-sialon phosphor particles were dispersed between the matrix phases containing spinel was observed.

Furthermore, the surface roughness Ra of the main surface of each phosphor plate was measured using a surface roughness measuring device (SJ-400 manufactured by Mitutoyo Corporation) in accordance with JIS B 0601.

In addition, the L* a* b* color coordinates of the obtained phosphor plate were measured by a device in which an integrating sphere device (ISV-469) was attached to an ultraviolet-visible spectrophotometer (V-550) manufactured by JASCO Corporation.

Specifically, first, the base correction was performed with a standard white panel (Spectralon manufactured by Labsphere Inc.). Then, the phosphor plate was set so as to be sandwiched between the inter-rating sphere device and the standard white panel, and the measurement was performed in the wavelength range of 300 to 850 nm. Then, the L* value, the a* value, and the b* value were calculated in accordance with JIS Z 8781-4:2013.

($Al_2O_3$)

$Al_2O_3$-1: TM-DAR (manufactured by Taimei Chemicals Co., Ltd.) with a BET specific surface area of 14.5 $m^2/g$ $Al_2O_3$-2: AKP-53 (manufactured by Sumitomo Chemical Co., Ltd.) with a BET specific surface area of 11.7 $m^2/g$ $Al_2O_3$-3: AKP-20 (manufactured by Sumitomo Chemical Co., Ltd.) with a BET specific surface area of 4.3 $m^2/g$ $Al_2O_3$-4: AKP-3000 (manufactured by Sumitomo Chemical Co., Ltd.) with a BET specific surface area of 4.5 $m^2/g$ $Al_2O_3$-5: AA-03 (manufactured by Sumitomo Chemical Co., Ltd.) with a BET specific surface area of 5.2 $m^2/g$ ($SiO_2$: For Comparative Examples)

$SiO_2$-1: SFP-30M (manufactured by Denka Company Limited) with a BET specific surface area of 6.2 $m^2/g$ $SiO_2$-2: FB-9SDC (manufactured by Denka Company Limited) with a BET specific surface area of 1.4 $m^2/g$ The BET specific surface area of each of the above-described materials is a value measured in accordance with JIS Z 8830:2013 using a specific surface area/pore distribution measuring device BELSORP-mini (manufactured by MicrotracBEL Corp.).

In Table 1, "BET specific surface area" is a value of "BET specific surface area of MgO×mass ratio of MgO in spinel raw material powder (28/100)+BET specific surface area of $Al_2O_3$×mass ratio of $Al_2O_3$ in spinel raw material powder (72/100)". In other words, the BET specific surface area in Table 1 represents the specific surface area of the spinel raw material powder "as a whole" containing 28% by mass of MgO and 72% by mass of $Al_2O_3$.

TABLE 1

| | α-sialon | | Spinel raw material powder | | BET specific surface area (m2/g) | Plate thickness (mm) | Color coordinates | | | | Ra (μm) |
| --- | --- | --- | --- | --- | --- | --- | --- | --- | --- | --- | --- |
| | Type | Content | MgO | $Al_2O_3$ | | | L* | a* | b* | a* + b* | |
| Example 1 | Phosphor 1 | 30 vol % | MgO-1 | $Al_2O_3$-1 | 11.0 | 0.214 | 86.0 | 2.5 | 13.2 | 15.7 | 0.38 |
| Example 2 | Phosphor 1 | 30 vol % | MgO-1 | $Al_2O_3$-2 | 9.0 | 0.217 | 86.0 | 3.5 | 13.4 | 16.9 | 0.33 |
| Example 3 | Phosphor 1 | 30 vol % | MgO-2 | $Al_2O_3$-1 | 16.2 | 0.203 | 81.6 | 4.8 | 11.7 | 16.5 | 0.43 |
| Example 4 | Phosphor 1 | 30 vol % | MgO-2 | $Al_2O_3$-2 | 14.2 | 0.202 | 81.2 | 5.2 | 11.7 | 16.9 | 0.59 |
| Example 5 | Phosphor 1 | 30 vol % | MgO-2 | $Al_2O_3$-5 | 9.6 | 0.209 | 82.3 | 5.6 | 12.1 | 17.7 | 0.44 |
| Example 6 | Phosphor 1 | 30 vol % | MgO-2 | $Al_2O_3$-4 | 9.1 | 0.214 | 82.6 | 5.3 | 12.0 | 17.3 | 0.54 |
| Example 7 | Phosphor 1 | 30 vol % | MgO-2 | $Al_2O_3$-3 | 8.9 | 0.197 | 84.2 | 5.2 | 12.5 | 17.7 | 0.42 |
| Example 8 | Phosphor 1 | 30 vol % | MgO-1 | $Al_2O_3$-3 | 3.7 | 0.215 | 88.9 | 4.1 | 14.5 | 18.6 | 0.34 |
| Example 9 | Phosphor 1 | 30 vol % | MgO-1 | $Al_2O_3$-5 | 4.4 | 0.205 | 88.2 | 4.0 | 14.0 | 18.0 | 0.48 |
| Example 10 | Phosphor 1 | 30 vol % | MgO-1 | $Al_2O_3$-4 | 3.9 | 0.209 | 85.6 | 5.0 | 13.1 | 18.1 | 0.47 |
| Comparative Example 1 | Phosphor 1 | 30 vol % | ($SiO_2$-1) | | 6.2 | 0.218 | 72.2 | 1.6 | 9.8 | 11.3 | 0.48 |
| Comparative Example 2 | Phosphor 1 | 30 vol % | ($SiO_2$-2) | | 1.4 | 0.225 | 85.6 | 3.4 | 13.1 | 16.6 | 0.55 |

The details of the raw materials shown in Table 1 are as follows.

(α-Sialon Phosphor)

Phosphor 1: Ca-α sialon phosphor (ALONBRIGHT YL-600B with a median diameter of 15 μm, manufactured by Denka Company Limited)

(MgO)

MgO-1: Magnesium oxide with an average particle size of 0.2 μm, a purity of 99.9%, and a BET specific surface area of 2.3 $m^2/g$, manufactured by FUJIFILM Wako Pure Chemical Corporation MgO-2: Magnesium oxide with a product number "MJ-30" and a BET specific surface area of 20.6 $m^2/g$, manufactured by Iwatani Chemical Industry Co., Ltd.

<Evaluation of Luminous Efficiency>

Figure 3:
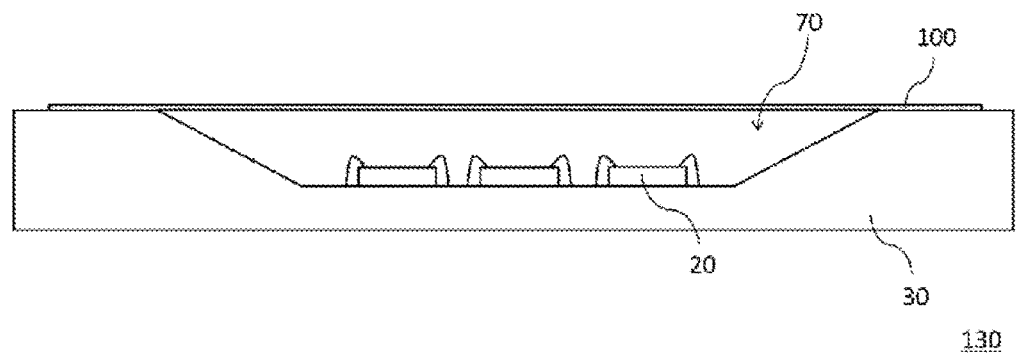
FIG. 3 is a schematic view of the device for measuring a luminous efficiency of the phosphor plate.

The luminous efficiency of the phosphor plate was evaluated using a chip-on-board type (COB type) LED package 130. FIG. 3 is a schematic view of a device (LED package 130) for measuring the emission spectrum of the phosphor plate 100.

First, an aluminum substrate (substrate 30) on which a recess 70 was formed was prepared. A diameter φ of the bottom surface of the recess 70 was 13.5 mm, and the diameter φ of the opening of the recess 70 was 16 mm. A blue LED (light emitting element 20) was mounted as a blue light emitting light source inside the recess 70 of the substrate 30.

After this, the circular phosphor plate 100 is installed above the blue LED so as to close the opening of the recess 70 of the substrate 30, and the device (chip-on-board type (COB type) LED package 130) shown in FIG. 3 was prepared.

Using a total luminous flux measurement system (Half-Moon, which is φ1000 mm integrating sphere system manufactured by Otsuka Electronics Co., Ltd.), the emission spectrum on the surface of the phosphor plate 100 when the blue LED of the prepared LED package 130 was turned on was measured.

In the obtained emission spectrum, the maximum value (W/nm) of the emission intensity (fluorescence intensity) of orange light having a wavelength within the range of being equal to or more than 585 nm and 605 nm was determined. Table 2 shows the relative values (%) of the other Examples and Comparative Examples when the maximum value of the fluorescence intensity was standardized with Example 1 as 100%.

TABLE 2

| | Emission intensity (Normalized value) |
|---|---|
| Example 1 | 100% |
| Example 2 | 106% |
| Example 3 | 102% |
| Example 4 | 106% |
| Example 5 | 112% |
| Example 6 | 109% |
| Example 7 | 111% |
| Example 8 | 114% |
| Example 9 | 115% |
| Example 10 | 120% |
| Comparative Example 1 | 25% |
| Comparative Example 2 | 62% |

From Table 2, the emission intensity (fluorescence intensity) of the phosphor plates of Examples 1 to 10 was larger than the emission intensity of the phosphor plates of Comparative Examples 1 and 2. In other words, it was shown that the phosphor plate formed of the complex containing the α-sialon phosphor and the sintered body containing spinel has excellent luminous efficiency.

According to more detailed analysis of Examples 1 to 10, the phosphor plates of Examples 5 to 10, in which the BET specific surface area of the spinel raw material powder was equal to or more than 0.1 $m^2/g$ and equal to or less than 10.0 $m^2/g$, and/or the sum of the a* value and the b* value was equal to or more than 17.0 and equal to or less than 19.5, showed excellent luminous efficiency.

This application claims priority based on Japanese application Japanese Patent Application No. 2019-192949 filed on Oct. 23, 2019. and incorporates all of its disclosures herein.

REFERENCE SIGNS LIST

10: phosphor plate
20: light emitting element
30: substrate
40: solder
50: electrode
60: bonding wire
70: recess
100: phosphor plate
100: light emitting device
120: light emitting device
130: LED package

The invention claimed is:

1. A phosphor plate comprising:
a complex containing an α-sialon phosphor and a sintered body containing spinel represented by a general formula $M_{2x}Al_{4-4x}O_{6-4x}$ (where M represents at least one of Mg, Mn, and Zn, and 0.2<x<0.6),
wherein a total value of a content of the α-sialon phosphor and the sintered body containing the spinel is equal to or more than 99% by volume and equal to or less than 100% by volume with respect to the entire complex.

2. The phosphor plate according to claim 1, wherein a content of the α-sialon phosphor is equal to or more than 5% by volume and equal to or less than 50% by volume with respect to an entire complex.

3. The phosphor plate according to claim 1, wherein the α-sialon phosphor includes an α-sialon phosphor containing an Eu element represented by a following general formula (1),

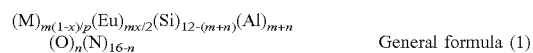

in general formula (1), M represents one or more elements selected from the group consisting of Li, Mg, Ca, Y, and lanthanide elements (excluding La and Ce), p represents a valence of the M element, and 0<x<0.5, 1.5≤m≤4.0 and 0≤n≤2.0.

4. The phosphor plate according to claim 1, wherein a median diameter $D_{50}$ of the α-sialon phosphor in the complex on a volume basis is equal to or more than 2 μm and equal to or less than 30 μm.

5. The phosphor plate according to claim 1, wherein a surface roughness Ra on a main surface of the phosphor plate is equal to or more than 0.01 μm and equal to or less than 2.0 μm.

6. The phosphor plate according to claim 1, wherein when a sum of an a* value and a b* value in an L*a*b* color coordinates of the main surface of the phosphor plate, which is measured in accordance with JIS Z 8781-4, is equal to or more than 17.0 and equal to or less than 19.5.

7. The phosphor plate according to claim 1, wherein the phosphor plate is used as a wavelength converter that converts emitted blue light into orange light and emits the converted orange light.

8. A light emitting device comprising:
a group III nitride semiconductor light emitting element; and
the phosphor plate according to claim 1 provided on one surface of the group III nitride semiconductor light emitting element.

9. A method for manufacturing the phosphor plate according to claim 1, the method comprising:
a firing step of heating a mixture containing an α-sialon phosphor and a spinel raw material powder, wherein the spinel raw material powder is (i) a powder containing spinel represented by the general formula, and/or (ii) a mixture of a metal oxide powder represented by a general formula MO (M represents at least one of Mg, Mn, and Zn) and an $Al_2O_3$ powder, and a BET specific surface area of the spinel raw material powder is equal to or more than 0.1 $m^2/g$ and equal to or less than 10.0 $m^2/g$.

10. A method for manufacturing a phosphor plate comprising a complex containing an α-sialon phosphor and a sintered body containing spinel represented by a general formula $M_{2x}Al_{4-4x}O_{6-4x}$, where M represents at least one of Mg, Mn, and Zn, and 0.2<x<0.6, the method comprising:

a firing step of heating a mixture containing an α-sialon phosphor and a spinel raw material powder, wherein the spinel raw material powder is (i) a powder containing spinel represented by the general formula, and/or (ii) a mixture of a metal oxide powder represented by a general formula MO, where M represents at least one of Mg, Mn, and Zn, and an $Al_2O_3$ powder, and a BET specific surface area of the spinel raw material powder is equal to or more than $0.1\ m^2/g$ and equal to or less than $10.0\ m^2/g$.

* * * * *